US00RE49800E

(19) United States
(12) Reissued Patent
Tsorng et al.

(10) Patent Number: US RE49,800 E
(45) Date of Reissued Patent: Jan. 16, 2024

(54) COMPUTER CHASSIS WITH SLIDING BRACKET

(71) Applicant: QUANTA COMPUTER INC., Taoyuan (TW)

(72) Inventors: Yaw-Tzorng Tsorng, Taoyuan (TW); Chun Chang, Taoyuan (TW); Tung-Hsien Wu, Taoyuan (TW)

(73) Assignee: QUANTA COMPUTER INC., Taoyuan (TW)

(21) Appl. No.: 17/560,917

(22) Filed: Dec. 23, 2021

Related U.S. Patent Documents

Reissue of:
(64) Patent No.: 10,579,110
Issued: Mar. 3, 2020
Appl. No.: 16/356,948
Filed: Mar. 18, 2019

(51) Int. Cl.
*H05K 7/20* (2006.01)
*G06F 1/18* (2006.01)

(52) U.S. Cl.
CPC ..... *G06F 1/181* (2013.01); *G06F 1/189* (2013.01)

(58) Field of Classification Search
CPC . H01L 23/473; H01L 23/467; H05K 7/20927; H05K 5/0021; G06F 1/181; G06F 1/184; G06F 1/189
USPC ..... 361/688–690, 724–727, 730, 732; 360/137
See application file for complete search history.

(56) References Cited

U.S. PATENT DOCUMENTS

| | | | | |
|---|---|---|---|---|
| 6,628,512 | B2 * | 9/2003 | Searby | G06F 1/181 361/679.58 |
| 8,194,404 | B2 * | 6/2012 | Xie | G06F 1/187 361/679.37 |
| 8,425,286 | B2 * | 4/2013 | Coster | G06F 1/181 361/695 |
| 9,207,724 | B2 * | 12/2015 | Coster | G06F 1/181 |
| 10,624,227 | B1 * | 4/2020 | Ni | G06F 1/181 |
| 2018/0102631 | A1 | 4/2018 | Johnson et al. | |

OTHER PUBLICATIONS

Extended European Search Report for EP Application No. 19188958.3, dated Feb. 27, 2020.

* cited by examiner

*Primary Examiner* — My Trang Ton
*Assistant Examiner* — Kenneth Whittington
(74) *Attorney, Agent, or Firm* — NIXON PEABODY LLP

(57) ABSTRACT

The present disclosure provides for a computer chassis design, which includes a sled and a sliding bracket. The sliding bracket includes a removable power supplier socket on a first end and a sliding return lever on the second end. When the sled is removed from the computer chassis, the removable power supplier socket can move out of the chassis via a set of mechanisms. The set of mechanisms can include an elastic element to cause the power supplier socket to automatically rotate out of the chassis. The sled can be shaped to extend behind the power supplier socket.

11 Claims, 9 Drawing Sheets

COMPUTER CHASSIS WITH SLIDING BRACKET

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a reissue of U.S. application Ser. No. 16/356,948.*

FIELD

The present disclosure relates to a chassis design with a designated space for cable routing and a power supply socket.

BACKGROUND

Space on a computer sled is highly desired, as conventional computer chassis demand greater complexity and variety of computer components on their sleds. Conventional computer chassis hold sleds housing a plurality of computer components. The computer chassis must be electrically powered to operate these components. Conventional computer chassis therefore provide narrower sleds to make space for a power supplier socket and any cabling along one edge of the computer chassis. Typically, the power supplier socket has a wider width than the cabling running to and from the socket. This disparity between the width of the power supplier socket and the cabling leads to a gap of unused space in the computer chassis along the length of the cabling and behind the power supplier socket.

Furthermore, conventional computer sleds are frequently loaded and unloaded from their corresponding chassis due to maintenance requirements or requests to change the components on the sled. Unloading a sled can be complicated and time-intensive for a user due to the cabling attached to various components on the sled. A user needs to remove the cabling, unload the sled, replace the computer components, reattach the cabling, and load the sled back into the chassis.

Therefore, an apparatus design is needed to make use of the space behind the power supplier socket.

SUMMARY

The various examples of the present disclosure are directed towards a computer chassis which includes a sled and a sliding rail bracket. The sliding bracket can have a first end and a second end, where the first end includes a removable power supplier socket. The removable power supplier socket can be configured to move out of the computer chassis via a set of mechanisms. Upon removing the power supplier socket from the computer chassis, the sled can be pulled out of the computer chassis.

In some examples, the set of mechanisms can include a rotational element and a first elastic element. A loaded position of the first elastic element can bias the power supplier socket to rotate away from the sled. In some examples, the rotational element can include an axis mechanically coupled to the first elastic element. The power supplier socket can rotate about the axis when moving into or out of the chassis.

In some examples, the sliding bracket can further include a sliding return lever. The sliding return lever can include a second elastic element and a pivot mechanism. Transitioning the sled into an unloaded position can cause the pivot mechanism to unload the second elastic element, as an edge of the sled passes a midpoint of the pivot mechanism. In a corresponding fashion, transitioning the sled into a loaded position can cause the pivot mechanism to load the second elastic element when an edge of the sled passes a midpoint of the pivot mechanism.

In some examples, unloading the second elastic element can cause the second elastic element to exert force on the sled; the exerted force can drive the sled out of the computer chassis.

In some examples, the sled can be indented around the removable power supplier socket. Between the sled and the sliding bracket, the computer chassis can further provide an opening configured to receive a cable.

In some examples, the sled can slide along the sliding bracket when transitioning between a loaded and an unloaded position. The sliding bracket can be configured to slidably extend along an interior edge of the computer chassis. The sliding bracket can include a stopping mechanism at the second end, configured to catch an edge of the sled as the sled is transitioning between a loaded and unloaded position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
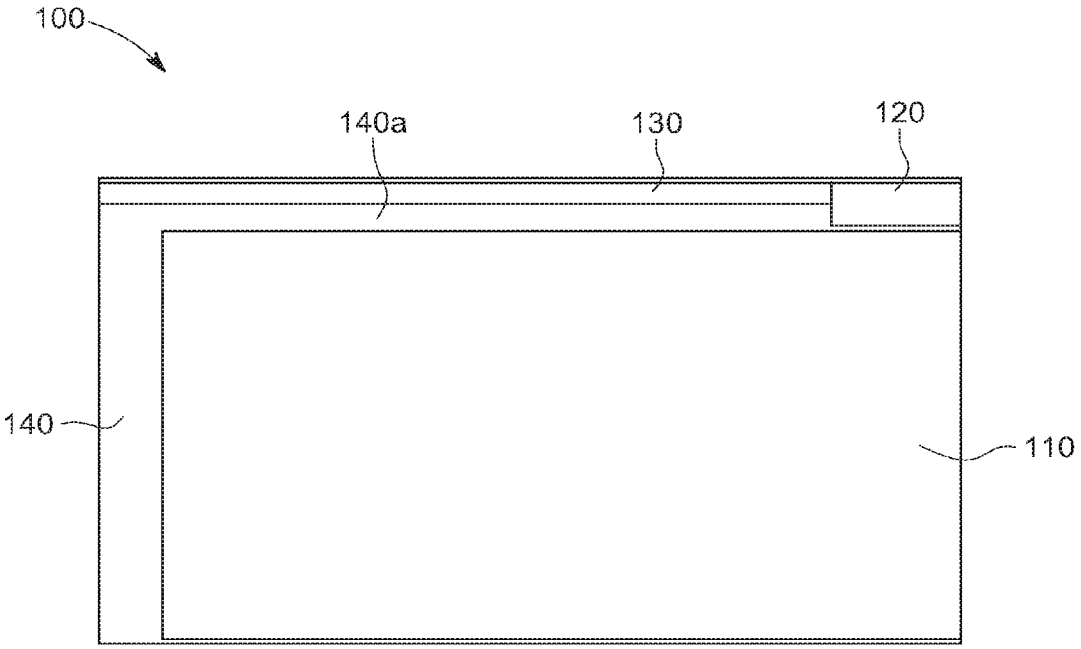
FIG. 1 (PRIOR ART)
FIG. 1 shows a prior art conventional computer chassis.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides for a computer chassis design which includes a sled and a sliding bracket. The sliding bracket can include a removable power supplier socket on a first end and a sliding return lever on the second end. When the sled is removed from the computer chassis, the removable power supplier socket can move out of the chassis via a set of mechanisms. The set of mechanisms can include an elastic element to cause the power supplier socket to automatically rotate out of the chassis. This automatic movement of the power supplier socket allows the sled to be easily pulled out of the chassis, even if the sled is shaped to extend behind the power supplier socket. Therefore, the present disclosure also provides for a sled shaped with an option behind the power supplier socket. This disclosed computer chassis design provides for both: (1) an increased amount of available space on the sled; and (2) an ease of loading and unloading the sled from the computer chassis. The increased amount of available space can be used to hold more electronic components, including, for example, dual in-line memory modules.

FIG. 1 shows a conventional computer chassis 100, according to the prior art. Chassis 100 can include a sled 110, a power supplier socket 120, a cable routing portion 130, and a chassis body 140. The sled 110 can house computer components (not pictured). The power supplier socket 120 can receive cables from the cable routing portion 130, and provide power to the components in the sled 110.

In a conventional chassis 100, the sled 110 takes up the majority of space in the chassis body 140, but the sled 110 is designed to be narrow enough to leave space in the chassis body 140 for the power supplier socket 120 and the cable routing portion 130. In conventional chassis 100, the sled 110 can slide into and out of the chassis body 140, and the sled 110 is sized so as to not overlap with the power supplier socket 120. Therefore, the power supplier socket 120 remains in place as the sled 110 loads or unloads from the chassis body 140.

Typically, a power supplier socket 120 is wider than the cables running to and from the power supplier socket 120, in the cable routing portion 130. Such a design, as shown in FIG. 1, results in empty space 140a in the chassis body 140, which is not used by the sled 110, and does not contain any computer components. Thus, empty space 140a does not provide an efficient use of the area provided in a conventional chassis body 140.

Figure 2:
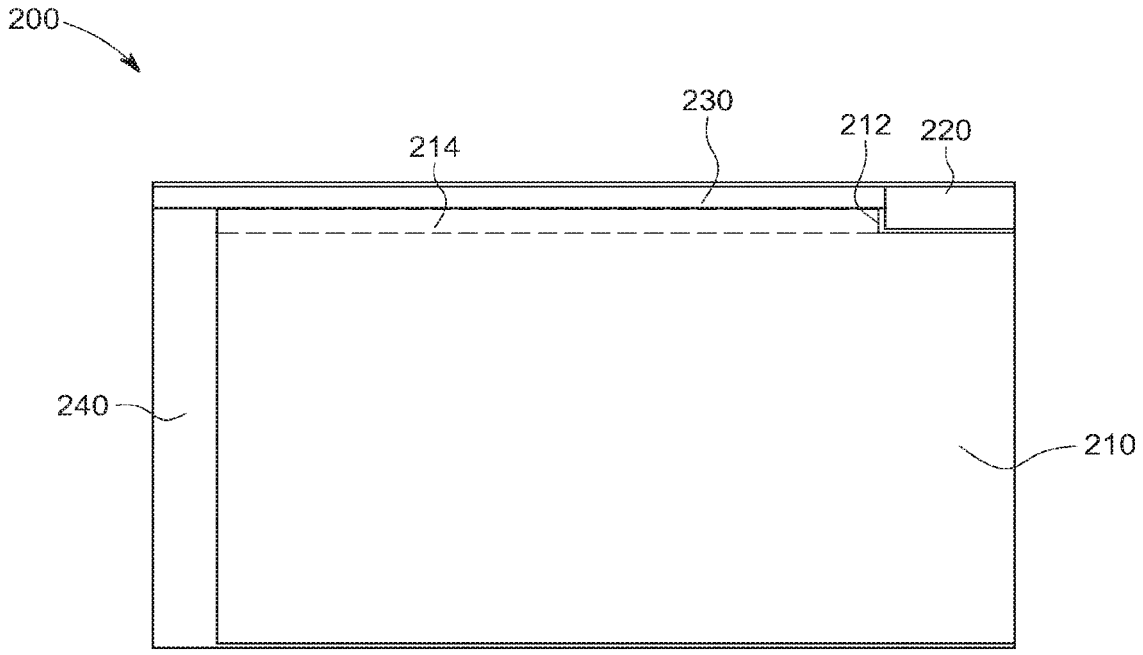
FIG. 2 shows an exemplary computer chassis, according to an embodiment of the present disclosure.

In response to the space limitations of conventional computer chassis shown in FIG. 1, the present disclosure provides for an exemplary computer chassis that makes use of the space 140a. FIG. 2 shows an exemplary computer chassis 200, according to an embodiment the present disclosure. Chassis 200 comprises a sled 210, an indented portion 212, extended space 214, a removable power supplier socket 220, a cable routing portion 230, and a chassis body 240.

The sled 210 can house computer components, be received into a chassis body 240, and allow space in the chassis body 240 for cable routing portion 230. Sled 210 provides a different design than the conventional sled 110 (of FIG. 1), because sled 210 includes an indented portion 212 and extended space 214. The indented portion 212 allows the sled 210 to extend beyond the removable power supplier socket 220, which provides extended space 214 on the sled 210 where additional components can be housed. Therefore, sled 210 provides a greater area for housing computer components than the conventional sled 110 shown in FIG. 1. The removable power supply socket 220 can be configured to automatically move into and out of the chassis body 240, according to the mechanisms discussed below with respect to FIGS. 3A-5D.

FIGS. 3A-5D show cut-away views of various positions of the computer chassis of FIG. 2, according to various embodiments of the present disclosure. FIGS. 3A-5D can include many components and similar labels to components in FIG. 2. In addition, FIGS. 3A-5D show a sliding rail bracket 310, a sliding return lever 320, a set of mechanisms 330, a stopping mechanism 340. The sliding return lever 320 can include an elastic element 410 and a pivot mechanism 420; the set of mechanisms 330 can include an elastic element 430 and a rotational element 440.

Figure 3A:
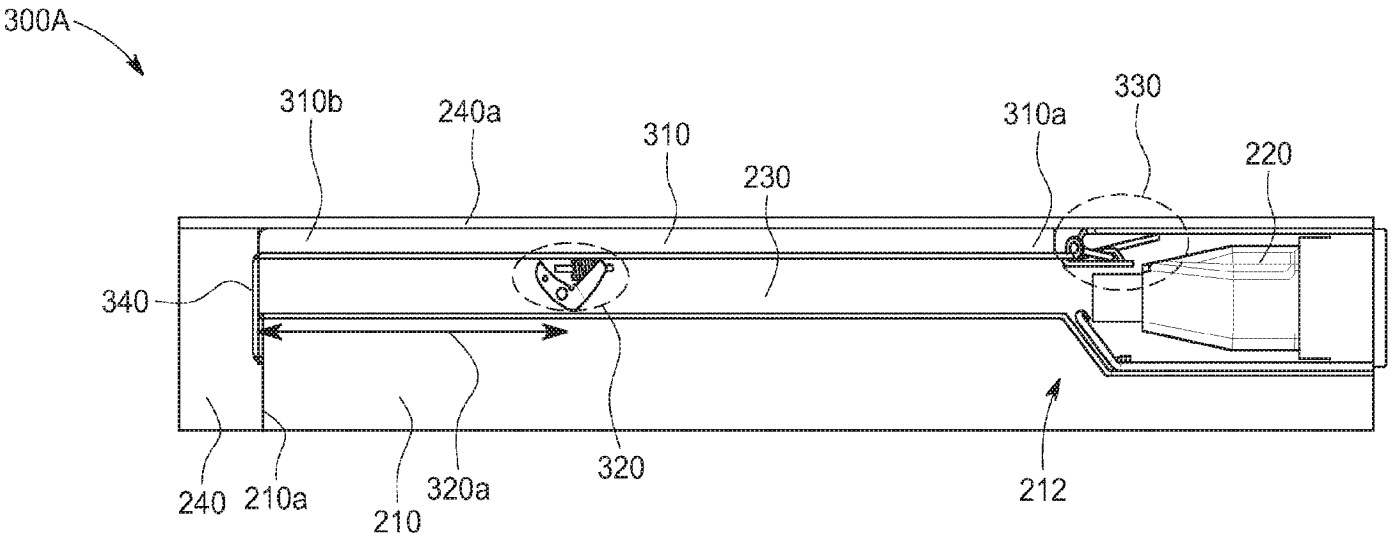
FIG. 3A shows a cutaway view of an exemplary computer chassis, according to an embodiment of the present disclosure.

FIG. 3A shows an entirely-loaded position 300A of the disclosed chassis, where the removable power socket 220 is fully received within the chassis 240. The disclosed chassis of FIG. 2 can include a sliding rail bracket 310 along an interior edge 240a of the chassis body 240. The sled 210 can slide along the sliding rail bracket 310 when loading into and out of chassis body 240. The sliding rail bracket 310 can also be coupled to a removable power supply socket 220 via a set of mechanisms 330 (discussed further with respect to FIG. 3B) located at a first end 310a of the sliding rail bracket 310. A second end 310b of the sliding rail bracket 310 can provide a stopping mechanism 340 (discussed further with respect to FIG. 5D).

Figure 3B:
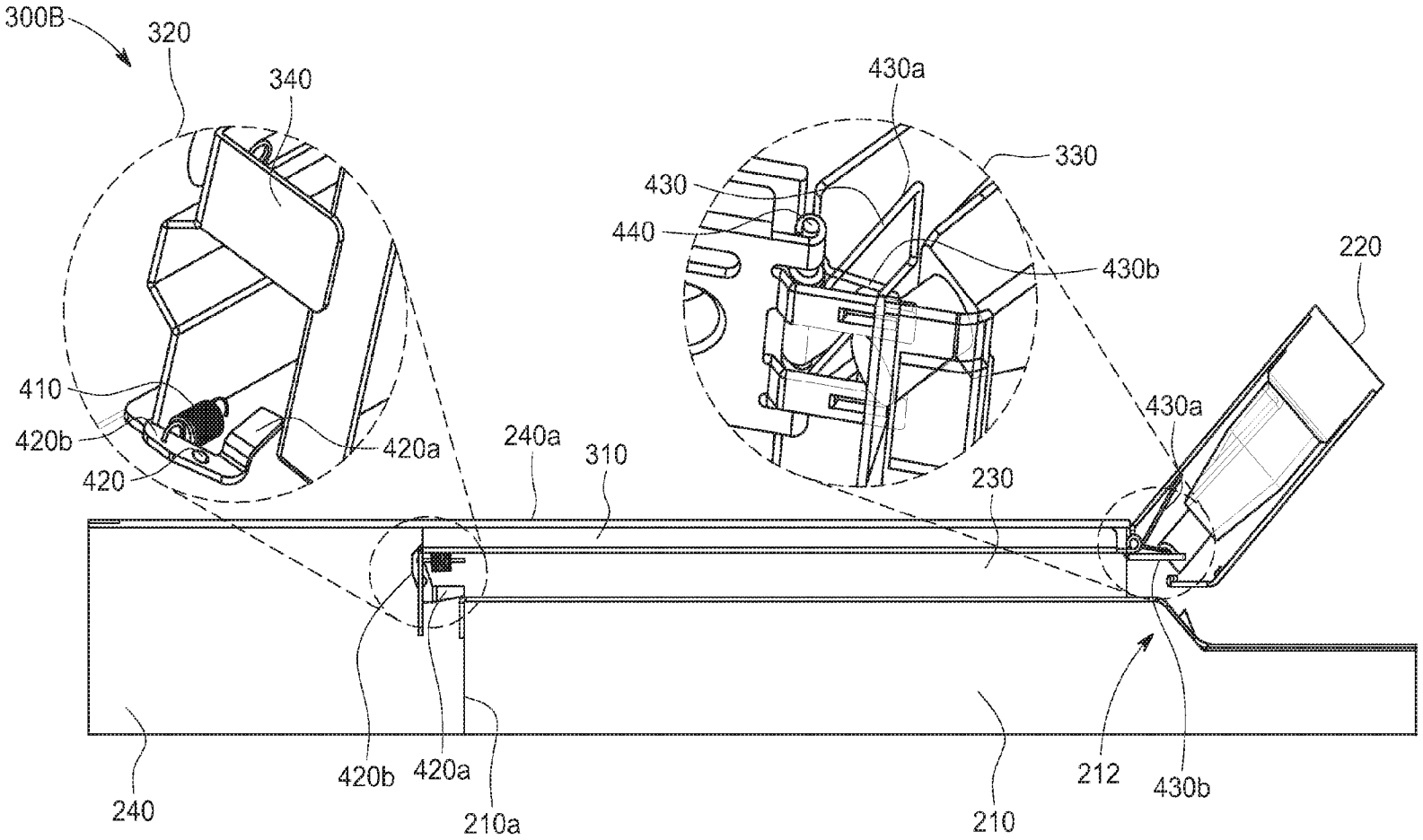
FIG. 3B shows close-up views of the ends of an exemplary sliding bracket, according to an embodiment of the present disclosure.

Lastly, sliding rail bracket 310 can include a sliding return lever 320 along a length of the sliding rail bracket 310 (discussed further with respect to FIG. 3B). The sliding return lever 320 can be fixed within the chassis body 240, so that movement of the sled 210 does not cause the sliding return lever 320 to move. In some examples of the present disclosure, the sliding return lever 320 can be fixed at a particular distance 320a from the second end 310b of the sliding rail bracket 310. The particular distance 320a can be a length of the removable power supplier socket 220.

FIG. 3B shows a partially-unloaded position 300B of the disclosed chassis, where the sled 210 is unloaded from the chassis body 240 so that the removable power supply socket 220 is fully outside of the chassis body 240. When the removable power supply socket 220 is outside of the chassis body 240, the rear edge 210a of the sled 210 engages with the sliding return lever 320.

Figure 5A:
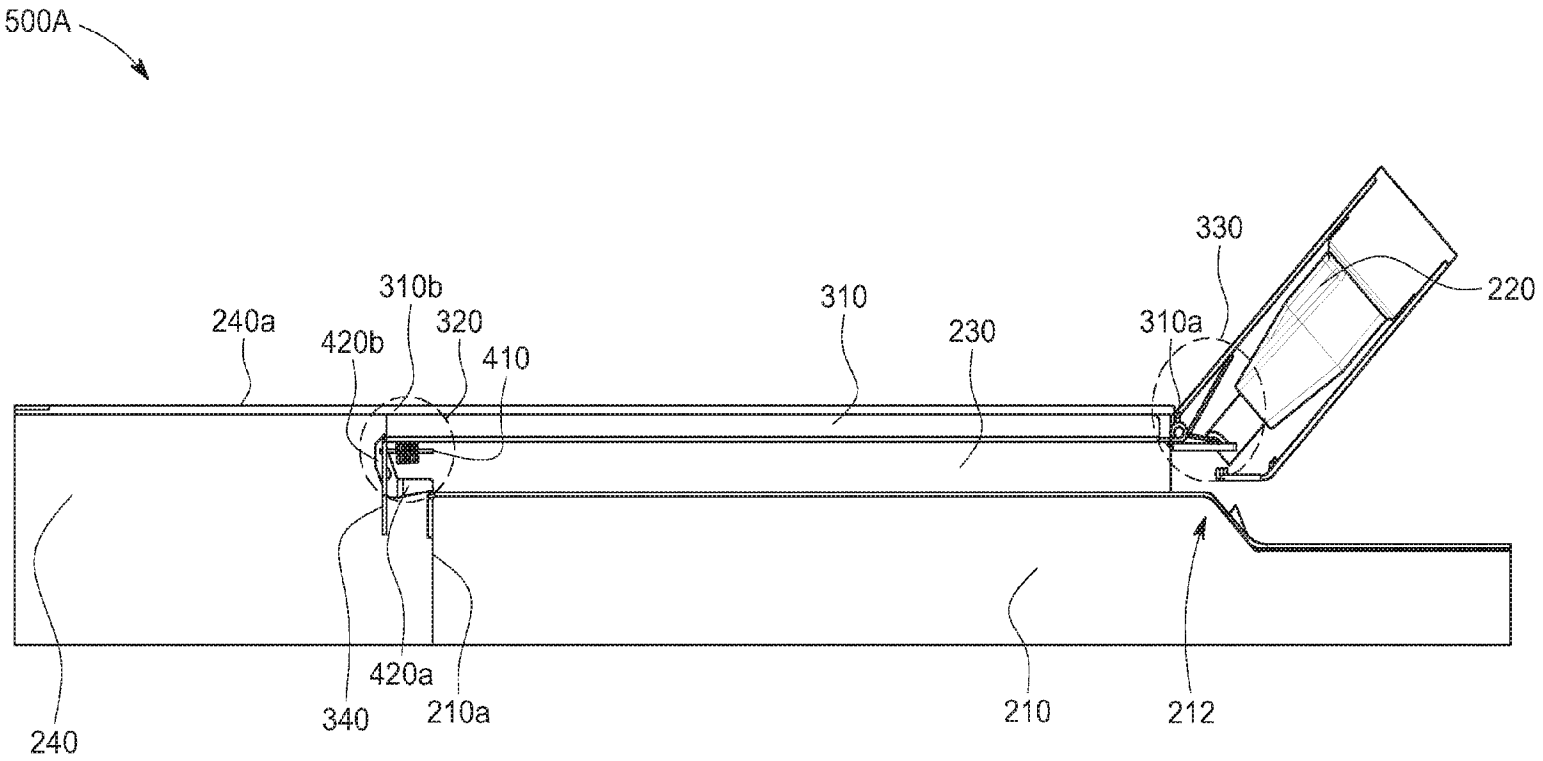
FIGS. 5A-5C show an exemplary sliding lever mechanism transitioning from an unloaded position into a loaded position, according to an embodiment of the present disclosure.

FIG. 3B further shows a close-up view of the sliding return lever 320, which includes an elastic element 410 and a pivot mechanism 420. The pivot mechanism 420 can have a first portion 420a, which receives the sled 210 as it is loaded into the chassis body 240. A second portion 420b of the pivot mechanism can be coupled to the elastic element 410. Referring momentarily to FIG. 5A, the sliding return lever 420 can be configured so that when the first portion 420a receives the sled 210 as it is loaded into the chassis body 240, the first portion 420a can move towards the elastic element 410. The movement of the first portion 420a can pivot the second portion 420b away from the elastic element 410, which consequently loads the elastic element 410. The elastic element can be an extension spring, for example. In other examples, the elastic element 410 can be any elastomer configured to be loaded when the sled 210 is loaded into the chassis body 240.

Referring back to FIG. 3B, the set of mechanisms 330 can include an elastic element 430 and a rotational element 440. The rotational element 440 can be a joint through which a portion of the elastic element 430 extends. The elastic element 430 can have a first portion 430a extending along a length of the removable power socket 220, and a second portion 430b extending towards the body of the removable power socket 220. Elastic element 430 in an unloaded position, where the removable power supplier socket 220 is configured to rotate away from the sled 210 due to the elastic force of the elastic element 430. The elastic element 430 can be loaded when the power supplier socket 220 is rotated towards the sled 210 (for example, when a user is loading sled 210 into the chassis body 240). For example, the elastic element 430 can be a compression spring. In other examples, the elastic element 430 can be any elastomer configured to be loaded when the power supplier socket 220 is rotated towards the sled 210.

Figure 4:
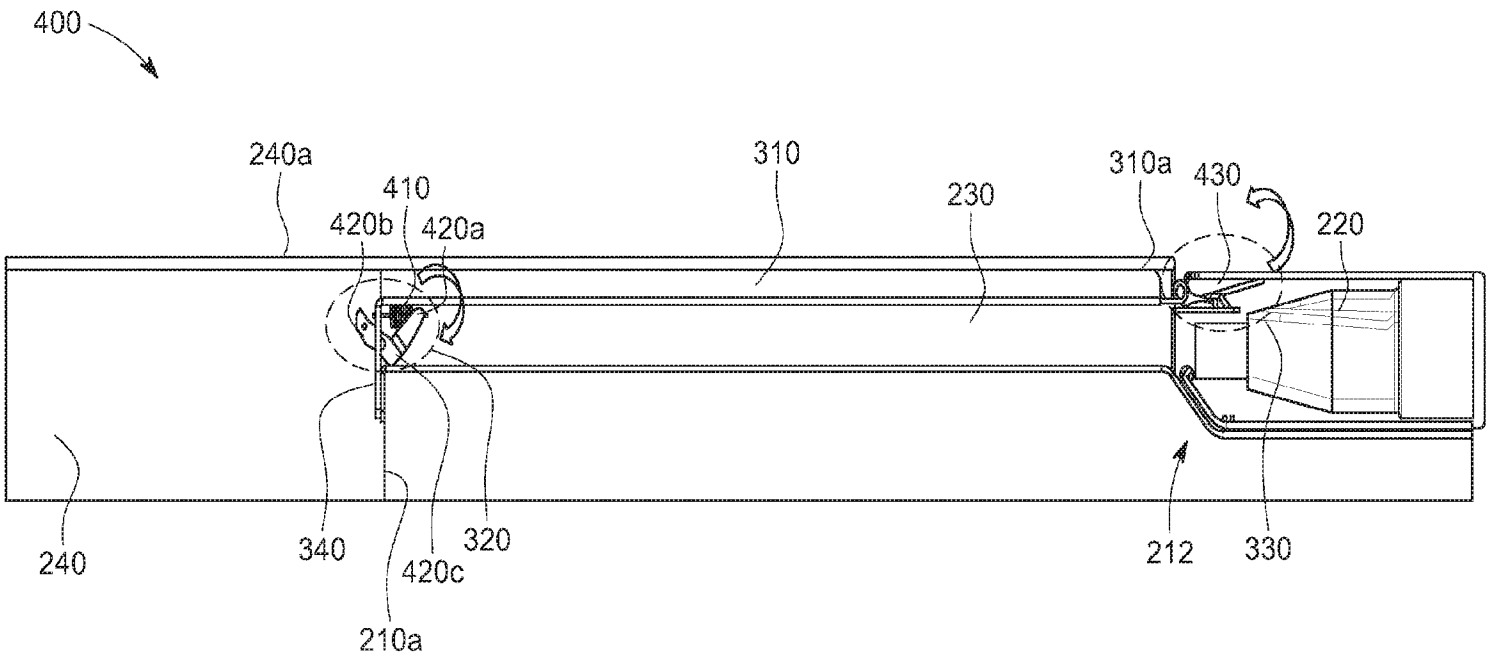
FIG. 4 shows an exemplary computer sled transitioning to an unloaded position, according to an embodiment of the present disclosure.

FIG. 4 shows an exemplary computer sled transition 400, where the sled 210 transitions from a loaded position in chassis body 240 to an unloaded position. As the sled 210 is pulled out of the chassis body 240, elastic element 410 biases the first portion 420a of pivot mechanism 420 to rotate away from the sliding bracket 310, towards the sled 210. When the rear edge 210a of the sled 210 passes over a midpoint 420c of the pivot mechanism 420, the elastic element 410 can unload, and can exert force moving the sled 210 out of the chassis body 340, along the sliding bracket 310. When the power supplier socket 220 is out of the chassis body 240, the elastic element 430 can exert force on the power supplier socket 220, causing the power supplier socket 220 to rotate away from the chassis body 240. Therefore, elastic elements 410 and 430 can contribute to automatic unloading of the sled 210 from the chassis body 240.

FIG. 5A shows an exemplary computer sled transition 500A, where the sled 210 transitions from an unloaded position to a loaded position. As discussed earlier with respect to FIG. 3B, the first portion 420a of the pivot mechanism 420 can be pushed towards the sliding bracket 310 as sled 210 is loaded into the chassis body. This can load the elastic element 410.

Figure 5B:
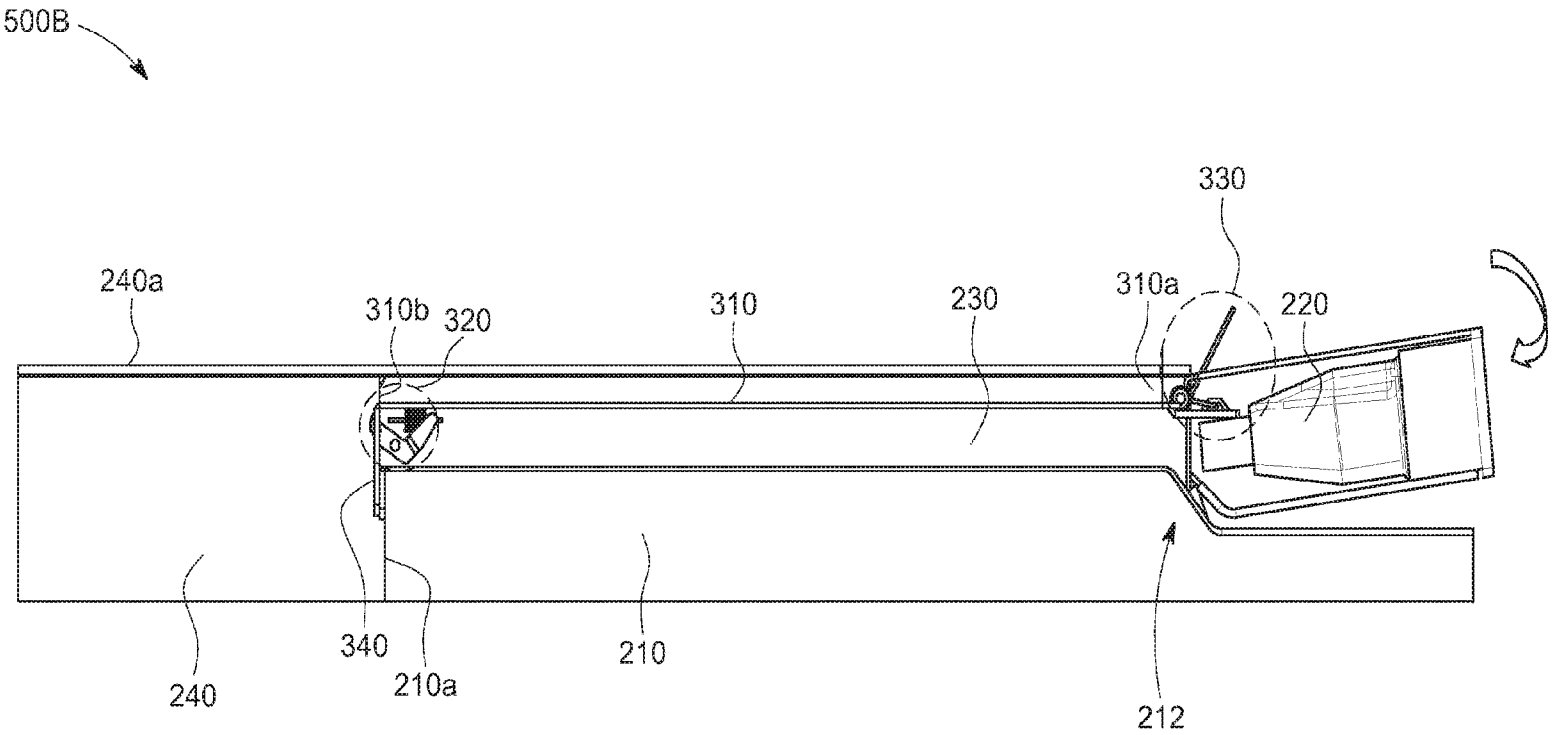

FIG. 5B shows an exemplary computer sled transition 500B. Transition 500B follows after transition 500A where sled 210 is pushed just past a midpoint 420c of pivot mechanism 420. Therefore, when sled 210 is loaded in chassis body 240, elastic element 410 will be loaded. Removable power socket 220 can be rotated towards computer sled 210 as sled 210 is loaded into chassis body 240.

Figure 5C:
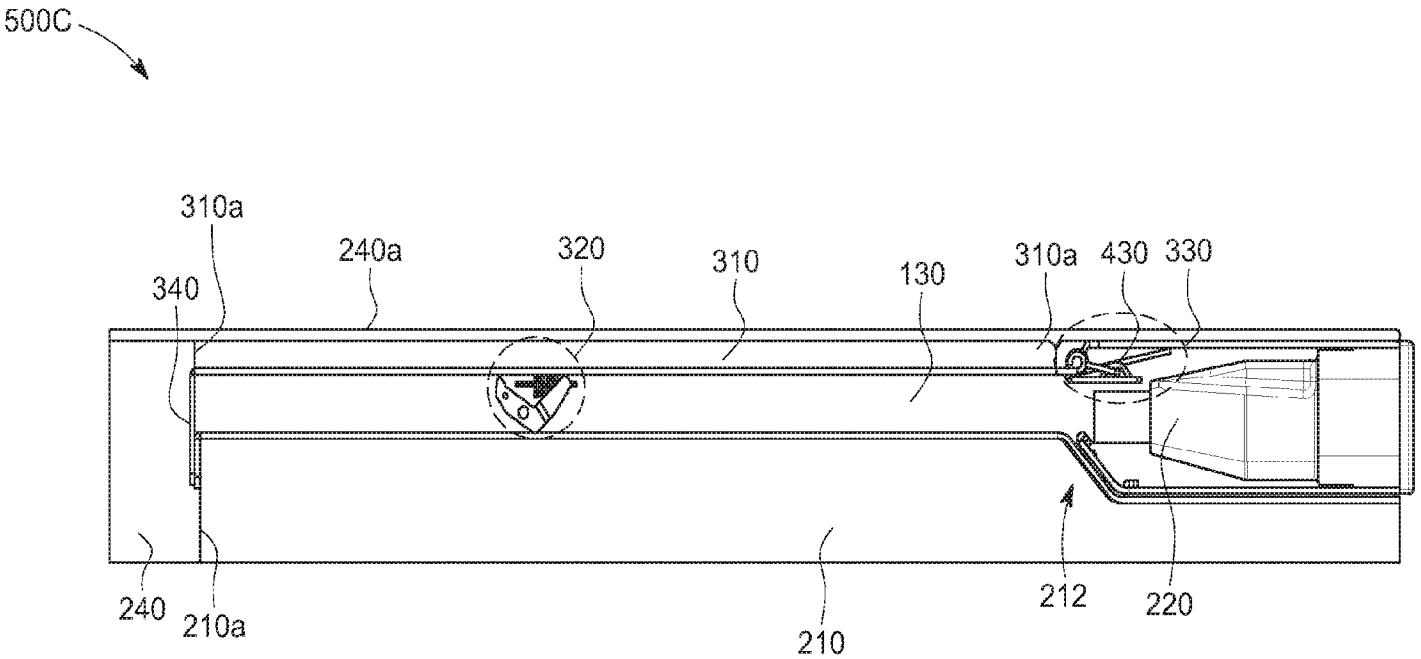

FIG. 5C shows an exemplary computer sled transition 500C where sled 210 is fully loaded into chassis body 240. Transition 500C can occur after transition 500B. Elastic element 430 is compressed against an interior edge 240a of chassis body 240.

Figure 5D:
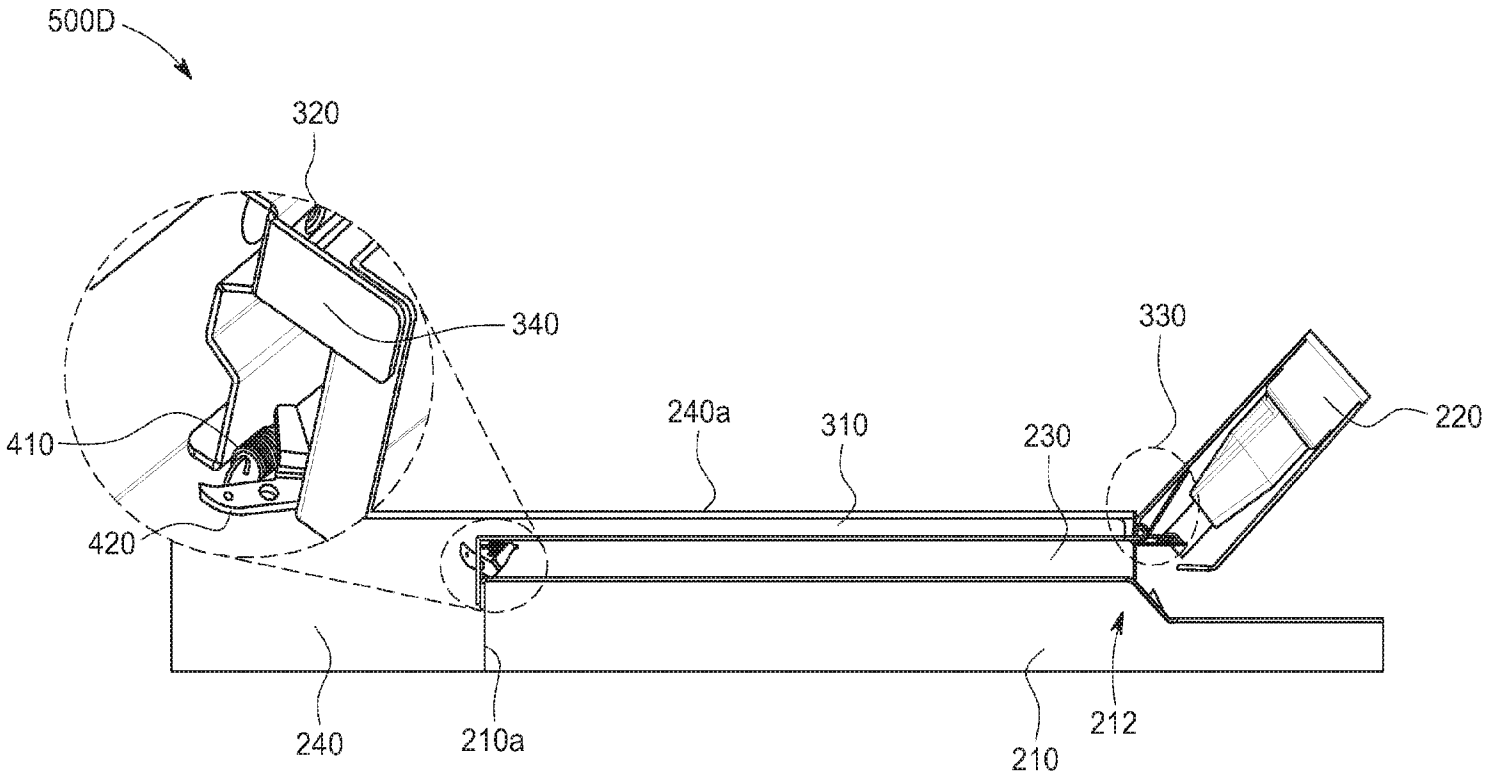
FIG. 5D shows an exemplary removable power socket transitioning from a loaded position into an unloaded position, according to an embodiment of the present disclosure.

FIG. 5D shows how the stopping mechanism 340 is of a sufficient length to extend from the sliding rail bracket 310 to the sled 210. The stopping mechanism 340 can receive a rear edge 210a of the sled 210 as the sled 210 is being loaded into the chassis body 240. Thereby, loading the sled 210 into the chassis body 240 can cause the sliding rail bracket 310 to slidably extend along the interior edge 240a of the chassis body 240.

Altogether, FIGS. 5A-5D show that sliding return lever 320 and mechanism 330 provide an apparatus to load and unload the computer sled without interference from the power supplier socket. This allows the disclosed chassis to make use of the space behind the power supplier socket, which is typically unused in conventional chassis designs.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computer chassis, comprising:

a sled; and a sliding bracket with a first end and a second end, the sliding bracket further comprising a stopping mechanism at the second end, configured to catch an edge of the sled, the sliding bracket further comprising a removable power supplier socket housed at the first end, the removable power supplier socket configured to be moved out of the computer chassis via a set of mechanisms comprising a rotational element and a first elastic element, wherein a loaded position of the first elastic element biases the *removable* power supplier socket to rotate away from the sled;

wherein the sliding bracket further comprises a sliding return lever at the second end, the sliding return lever comprising a second elastic element and a pivot mechanism; and wherein, upon the removable power supplier socket being moved out of the computer chassis, the sled is capable of being pulled out of the computer chassis.

2. The computer chassis of claim 1, wherein the rotational element further comprises an axis mechanically coupled to the first elastic element.

3. The computer chassis of claim 1, wherein transitioning the sled into a loaded position causes the pivot mechanism to load the second elastic element when an edge of the sled passes a midpoint of the pivot mechanism.

4. The computer chassis of claim 1, wherein the sled is indented around the removable power supplier socket.

5. The computer chassis of claim 1, further comprising an opening between the sled and the sliding bracket, the opening configured to receive at least one cable.

6. The computer chassis of claim 1, wherein the sled is configured to slide along the sliding bracket when transitioning between a loaded and an unloaded position.

7. The computer chassis of claim 1, wherein the sliding bracket is configured to slidably extend along an edge of the computer chassis.

8. The computer chassis of claim 1, wherein transitioning the sled into an unloaded position causes the pivot mechanism to unload the second elastic element when an edge of the sled passes a midpoint of the pivot mechanism.

9. The computer chassis of claim 8, wherein unloading the second elastic element causes the second elastic element to exert force moving the sled out of the computer chassis.

*10. The computer chassis of claim 1, wherein the second elastic element comprises an extension spring.*

*11. The computer chassis of claim 1, wherein the second elastic element comprises an elastomer.*

* * * * *